(12) United States Patent
Lin

(10) Patent No.: US 8,354,339 B2
(45) Date of Patent: Jan. 15, 2013

(54) METHODS TO FORM SELF-ALIGNED PERMANENT ON-CHIP INTERCONNECT STRUCTURES

(75) Inventor: Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 238 days.

(21) Appl. No.: 12/839,697

(22) Filed: Jul. 20, 2010

(65) Prior Publication Data

US 2012/0018891 A1     Jan. 26, 2012

(51) Int. Cl.
*H01L 21/768* (2006.01)
(52) U.S. Cl. ........ 438/618; 438/637; 438/725; 438/781; 257/E21.575
(58) Field of Classification Search ............... 438/618
See application file for complete search history.

(56) References Cited

U.S. PATENT DOCUMENTS

| | | | |
|---|---|---|---|
| 4,371,605 A | 2/1983 | Renner | |
| 5,886,102 A | 3/1999 | Sinta et al. | |
| 5,939,236 A | 8/1999 | Pavelchek et al. | |
| 6,087,064 A | 7/2000 | Lin et al. | |
| 6,893,972 B2 * | 5/2005 | Rottstegge et al. | 438/706 |
| 7,041,748 B2 | 5/2006 | Lin et al. | |
| 7,056,840 B2 | 6/2006 | Miller et al. | |
| 2008/0286467 A1 | 11/2008 | Allen et al. | |
| 2009/0079076 A1 | 3/2009 | Lin et al. | |
| 2009/0081418 A1 | 3/2009 | Allen et al. | |
| 2009/0233226 A1 | 9/2009 | Allen et al. | |
| 2009/0291389 A1 | 11/2009 | Allen et al. | |

FOREIGN PATENT DOCUMENTS

| | | |
|---|---|---|
| CA | 1204547 | 5/1986 |
| JP | 01293339 | 11/1989 |

OTHER PUBLICATIONS

U.S. Appl. No. 12/569,200 entitled, "Patternable Low-k Dielectric Interconnect Structure With a Graded Cap Layer and Method of Fabrication", filed Sep. 29, 2009, first named inventor: Qinghuang Lin.

* cited by examiner

*Primary Examiner* — Thanh Nguyen
(74) *Attorney, Agent, or Firm* — Scully, Scott, Murphy & Presser, P.C.; Louis J. Percello, Esq.

(57) ABSTRACT

Methods of fabricating a self-aligned permanent on-chip interconnect structure are provided. In one embodiment, the method includes forming a patterned photoresist having at least one opening on a surface of a substrate. A dielectric sidewall structure is then formed on each sidewall of the patterned photoresist and within the at least one opening. A narrowed width opening is present between neighboring dielectric sidewall structures. The patterned photoresist is then removed and thereafter each dielectric sidewall structure is converted into a permanent patterned dielectric structure which is self-aligned and double patterned. At least an electrically conductive material is formed within the narrowed width openings.

23 Claims, 7 Drawing Sheets

METHODS TO FORM SELF-ALIGNED PERMANENT ON-CHIP INTERCONNECT STRUCTURES

FIELD OF THE INVENTION

The present disclosure relates to semiconductor interconnect structures and methods of fabricating the same. More particularly, the present disclosure relates to methods of forming self-aligned permanent on-chip interconnect structures that include cured dielectric sidewall structures as permanent on-chip insulators using a self-aligned single exposure, double patterning technique.

BACKGROUND

It is widely known that the speed of propagation of interconnect signals is one of the most important factors controlling overall circuit speed as feature sizes are reduced and the number of devices per unit area as well as the number of interconnect levels are increased. Throughout the semiconductor industry, there has been a strong drive to reduce the dielectric constant, k, of the interlayer dielectric (ILD) materials used to electrically insulate metal lines. As a result, interconnect signals travel faster through conductors due to a reduction in resistance-capacitance (RC) delays.

State-of-the-art semiconductor chips employ copper (Cu) as the electrical conductor and inorganic organosilicates as the low dielectric constant (low k) dielectric, and have up to twelve levels of Cu/low k interconnect layers. These Cu/low k interconnect layers are fabricated with an iterative additive process, called dual damascene, which includes several processing steps including, for example, film deposition, patterning by lithography and reactive ion etching, liner (Cu barrier) deposition, Cu metal fill by electrochemical plating, and chemical-mechanical polishing of excessive Cu metal; these steps are described in greater detail in the following paragraphs.

When fabricating integrated circuit wiring within a multi-layer interconnect scheme, an insulating or dielectric material, e.g., silicon oxide or a low k insulator will normally be patterned with at least several thousand openings to create conductive line openings and/or via openings using photo patterning and plasma etching techniques, e.g., photolithography with a photoresist subsequently followed by etching by plasma processes. These via and line openings are typically filled with a conductive metal material, e.g., aluminum, copper, or their alloys etc., to interconnect the active and/or passive elements of the integrated circuits. The semiconductor device is then polished to level its surface.

A continuous cap layer is then normally deposited over the planarized surface featuring the dielectric material and conductive metal material. Next, a dielectric material is deposited over the continuous cap layer, via and conductive line openings are created again within the dielectric layer as before, another conductive metal material is deposited within the openings and another continuous cap layer is deposited thereon. The process is repeated to fabricate a multi-layer interconnect wiring system. The multi-layer interconnect system built thereby is referred to in the art as a dual damascene integration scheme.

Unfortunately, the strategy to introduce low k materials (typically dielectrics whose dielectric constant is below that of silicon oxide) into advanced interconnects is difficult to implement due to the new materials chemistry of the low k materials that are being introduced. Moreover, low k materials exhibit fundamentally weaker electrical and mechanical properties as compared to silicon oxide. Further, the patterned dielectric alternatives are typically susceptible to damage during the various interconnect processing steps. The damage observed in the low k materials is manifested by an increase in the dielectric constant and increased moisture uptake, which may result in reduced performance and device reliability.

Optical lithography has been the workhorse to continuously shrink (or scale) semiconductor devices and their related interconnect structures. Traditional scaling by optical lithography has been achieved with one single exposure mostly by reduction in the wavelength of the light sources, new tool design (higher numerical aperture or NA), improved lithographic materials or a combination thereof. Recently, multiple patterning, particularly double patterning techniques, where one particular level of circuitry is patterned by exposing the wafer to the light sources using two mask sets, has become increasingly necessary to maintain the pace of scaling at 193 nm optical wavelength. This type of double patterning necessitates significantly increase in complexity and the attendant increased manufacturing costs. Furthermore, this type of double patterning requires precise placement of the second exposure over the patterns formed by the first exposure. Any imperfect placement, or mis-alignment or overlay error, can cause degradation in performance or reliability or both. Such mis-alignment is due to the limitation of the lithographic tool employed or processing errors.

One way to overcome the integration challenges of low k materials mentioned above is to protect low k materials by adding at least one sacrificial hardmask layer onto a surface of the low k material. While the hardmask layer serves to protect the low k material, the presence of the sacrificial hardmask layer adds enormous process complexity and manufacturing as additional film deposition, pattern transfer etch, and removal of the hardmask layers are needed.

A state-of-the-art back-end-of-the-line (BEOL) integration process, called a low temperature oxide (LTO) process, employs up to eight layers of sacrificial hardmask materials to fabricate a two-layer dual damascene interconnect structure.

For example, a via-first LTO integration for forming a dual damascene interconnect includes the steps of: depositing a dielectric material on a substrate including a patterned conductor; forming at least one via in the dielectric material, such that at least one of the vias is positioned over the patterned conductor; depositing a layer of planarizing material on the dielectric material and in the via; depositing a layer of barrier material on the layer of planarizing material; depositing at least one layer of imaging material on the layer of barrier material; forming at least one trench in the imaging material, barrier material and planarizing material, such that the at least one trench is positioned over the via; removing the imaging material, either after or concurrently with forming the trench in the planarizing material; transferring the at least one trench to the dielectric material, such that at least one of the trenches is positioned over the via; removing the barrier material, either after or concurrently with transferring the at least one trench to the dielectric material; and removing the planarizing material.

A line-first LTO integration for forming a dual damascene interconnect structure includes the steps of: depositing a dielectric material on a substrate including a patterned conductor; forming at least one trench in the dielectric material, such that the at least one trench is positioned over the patterned conductor; depositing a layer of planarizing material on the dielectric material and in the trench; depositing a layer of barrier material on the layer of planarizing material; depositing at least one layer of imaging material on the layer of barrier material; forming at least one via in the imaging material, barrier material and planarizing material, such that at least one of the vias is positioned over the trench and the patterned conductor; removing the imaging material, either after or concurrently with forming the via in the planarizing material; transferring the at least one via to the dielectric material, such that at least one of the vias is positioned over the trench and the patterned conductor; removing the barrier material, either after or concurrently with transferring the at least one via to the dielectric material; and removing the planarizing material.

The prior art dual damascene integration schemes, such as the LTO one mentioned above, are very complex, inefficient, and costly. For example, the via-first LTO integration scheme requires ten layers of films and twenty-one process steps to form a two-layer dual damascene dielectric structure. In other words, 80% of the films are not needed in the final interconnect structure.

Although immensely popular in semiconductor manufacturing, the prior art dual damascene integration scheme described above suffers from several drawbacks including, for example, First, it constitutes a significant portion of manufacturing cost of advanced semiconductor chips as many layers, up to twelve layers for the state-of-the-art chips, are required to connect the minuscule transistors within a chip and to the printed circuit board. Second, it is a main yield detractor as the many layers of films required to form the interconnects generate chances for defect introduction and, thus, degrade manufacturing yields. Third, it is very inefficient and embodies enormous complexity. The current dual damascene integration scheme requires many sacrificial films (80% of the film stack) to pattern and protect the fragile interlayer dielectric films from damage during processing. These sacrificial patterning and protective films have to be removed after patterning and copper plating. Fourth, the performance gain by introduction of new lower-k materials is often offset by the need for higher-k non-sacrificial protective materials, such as a cap layer, a hardmask layer, or a thicker copper barrier layer. Fifth, the prior art complex dual damascene process lengthens manufacturing turn-around time and R&D development cycle. Sixth, the plasma etching process is an expensive and often unreliable process and requires significant up-front capital investment. Seventh, the aforementioned mis-alignment during double exposure, double patterning can cause degradation in performance and reliability of the resultant chips.

In view of the above, there is a need to simplify the formation of double patterned interconnects, including dielectrics for improved performance, reliability, cost-saving and manufacturing efficiency without mis-alignment as in the case with a traditional double exposure patterning scheme.

SUMMARY

Simplified methods of fabricating a self-aligned permanent on-chip interconnect structure are provided. In some embodiments, the present disclosure provides an interconnect structure with differently sized conductive features on the same interconnect level. By "differently sized" it is meant that some of the conductive features within the same interconnect level have different widths.

The methods of this disclosure utilize a single exposure, double patterning technique. In particular, the methods of the present disclosure include providing a patterned photoresist and then forming dielectric sidewall structures on the sidewalls of the patterned photoresist. The dielectric sidewall structures are comprised of a dielectric coating material that can be crosslinked with residual acid present in the sidewalls of the patterned photoresist and can form a permanent patterned dielectric material upon subsequent curing. More particularly, the dielectric coating material includes a polymer, copolymer or blend of polymers and/or copolymers having at least one reactive group. The term "at least one reactive group" when referring to the dielectric coating material denotes one or more acid-sensitive reactive groups. The methods of the present disclosure improve resolution and the placement of the structure since a self-aligned sidewall double patterning technique is employed.

In one embodiment, the method includes forming a patterned photoresist having at least one opening on a surface of a substrate. Dielectric sidewall structures are then formed on each sidewall of the patterned photoresist and within the at least one opening. An opening is located between neighboring dielectric sidewall structures that has a narrower width than that of the at least one opening in the patterned photoresist. The opening between neighboring dielectric structures is referred to herein as a "narrowed width opening". The patterned photoresist is then removed to provide additional second openings between neighboring dielectric sidewall structures and thereafter each dielectric sidewall structure is converted into a permanent patterned dielectric structure. The converting of each dielectric sidewall structure into a permanent patterned dielectric structure can be achieved by curing. At least an electrically conductive material is formed within at least each narrowed width opening and the additional openings that are located between neighboring permanent patterned dielectric structures. The size of the narrowed width openings can be the same as, or different from, that of the additional openings formed by removal of the patterned photoresist.

In some embodiments, the method further includes etching portions of the substrate that are exposed by the narrowed width openings and additional openings prior to forming the electrically conductive material. The etching of portions of the substrate can occur prior to, or after, converting the dielectric sidewall structures into permanent patterned dielectric structures.

The dielectric sidewall structures are formed by overfilling the at least one opening with a dielectric coating material. After the overfilling step, a baking step is performed to cause diffusion of residual acid from sidewalls of the patterned photoresist into neighboring sidewall portions of the dielectric coating material and cros slinking of the neighboring sidewall portions of the dielectric coating material. The non-crosslinked portions of the dielectric coating material are then removed relative to the crosslinked neighboring sidewall portions of the dielectric coating material by rising with an appropriate solvent or solution.

In another embodiment of the present disclosure, a dual damascene method is provided that includes providing a patterned dielectric material having a plurality of first openings on an upper surface of a substrate; forming a patterned photoresist having second openings atop the patterned dielectric material, wherein a portion of the patterned photoresist remains in at least one of the plurality of first openings; forming a dielectric sidewall structure on each sidewall of the patterned photoresist within said second openings and atop an upper surface of the patterned dielectric material, wherein said dielectric sidewall structure narrows the second openings providing narrowed width second openings; removing the patterned photoresist to provide a third opening between neighboring dielectric sidewall structures, wherein said narrowed width second openings and said third opening are located atop and are connected with one of said plurality of first openings; converting each dielectric sidewall structure into a self-aligned permanent patterned dielectric structure; and filling each opening with at least an electrically conductive material. The sizes of the first, the narrowed width second and the third openings can be the same or different.

In another aspect of the present disclosure, an interconnect structure (single damascene and dual damascene) is provided in which differently sized conductive features are present at a same interconnect level. The differently sized conductive features are laterally adjacent each other. That is, differently sized conductive features all have bottom surfaces located at a same horizontal level (e.g., plane) within the interconnect structure and top surfaces that are located on a same horizontal level (e.g., plane) within the interconnect structure. The differently sized conductive features are formed in some embodiments depending on the width of each dielectric sidewall structure formed. In general terms, an interconnect structure is provided that includes at least one permanent patterned dielectric layer located on a substrate, wherein said at least one permanent patterned dielectric layer includes differently sized conductive features embedded therein, said different sized conductive features are laterally adjacent to each other and are located at a same interconnect level.

The at least one patterned dielectric layer mentioned above is comprised of a cured reaction product of an acid catalyzed crosslinked functionalized polymer, copolymer, or a blend including at least two of any combination of polymers and/or copolymers having one or more acid-sensitive reactive groups.

A dielectric composition is also provided herein that includes a functionalized polymer, copolymer, or a blend including at least two of any combination of polymers and/or copolymers having one or more acid-sensitive reactive groups; and at least one solvent that is compatible with photoresist patterns. By "compatible with", it is meant that the application of the dielectric composition directly over the photoresist patterns does not substantially alter the size, the shape, and other features of the photoresist patterns.

DETAILED DESCRIPTION

The present disclosure, which provides self-aligned sidewall double patterning techniques and interconnect structures that are formed by the same, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference is first made to FIGS. 1-7 which illustrate one embodiment of the present disclosure. Specifically, FIGS. 1-7 illustrate an embodiment in which a single damascene interconnect structure is formed using a self-aligned sidewall double patterning technique in accordance with the present disclosure.

Figure 1:
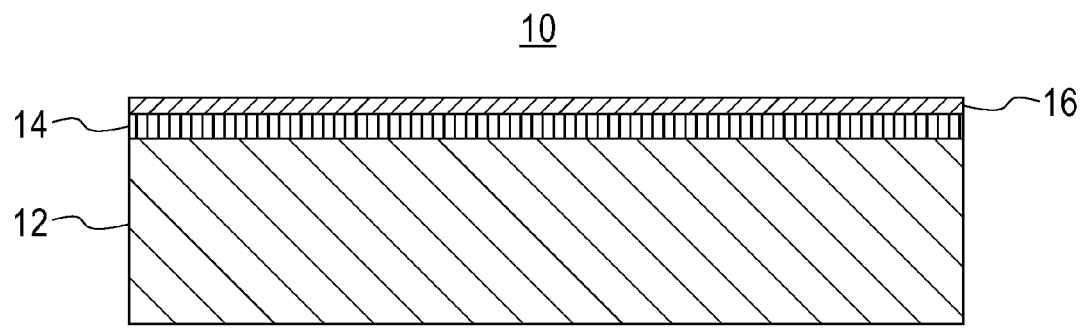
FIG. 1 is a pictorial representation (through a cross sectional view) illustrating an initial structure that can be employed in one embodiment of the present disclosure.

Referring first to FIG. 1, there is illustrated an initial structure 10 that can be employed in one embodiment of the present disclosure. The initial structure 10 of FIG. 1 includes a substrate 12, an optional dielectric cap 14 and an antireflective coating (ARC) 16. The ARC 16 may be located on an upper surface of the optional dielectric cap 14, if present. Alternatively, and when the optional dielectric cap 14 is not present, the ARC 16 is located on an upper surface of substrate 12.

Substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. Substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride, carbon nanotubes, graphene or combinations thereof including multilayers.

When present, the optional dielectric cap 14 can be formed directly on an upper surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The optional dielectric cap 14 can include any suitable dielectric capping material such as, for example, SiC, SiN, $SiO_2$, a carbon doped oxide, a nitrogen and hydrogen doped silicon carbide SiC(N,H) or multilayers thereof. The optional dielectric cap 14 can be a continuous layer or a discontinuous layer. The optional dielectric cap 14 can be a layer with graded composition in the vertical direction. The optional dielectric cap 14 can also be a select cap, such as CoWP.

After deposition of the optional dielectric cap 14, a post deposition treatment may be applied to the optional dielectric cap 14 to modify the properties of either the entire layer or the surface of the optional dielectric cap 14. This post deposition treatment can be selected from heat treatment, irradiation of electromagnetic wave (such of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the optional dielectric cap 14, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 12 can withstand, usually 500° C. This heat treatment can be conducted in an inert environment or within a chemical environment in a gas phase or a liquid phase. This treatment step may or may not be performed in the same tool as that used in forming the optional dielectric cap 14.

The post deposition treatment by irradiation of electromagnetic wave can be by ultra-violet (UV) light, microwave and the like. The UV light can be broadband with a wavelength range from 100 nm to 1000 nm. The post deposition treatment can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present disclosure: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the optional dielectric cap 14.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the optional dielectric cap 14.

The post deposition chemical treatment may be conducted in a gas phase or a liquid phase. The following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire optional dielectric cap 14 or is limited only to the surface of the optional dielectric cap 14. Example chemicals include adhesion promoters such as silanes, siloxanes and silylation agents. This treatment step may or may not be performed in the same tool as that used in forming the optional dielectric cap 14.

The thickness of the optional dielectric cap 14 may vary depending on the technique used to form the same as well as the material make-up of the layer. Typically, the optional dielectric cap 14 has a thickness from 1 nm to 100 nm, with a thickness from 20 nm to 45 nm being more typical.

As stated above, antireflective coating (ARC) 16 can be formed on a surface of the optional dielectric cap 14 if present, or directly on a surface of the substrate 12 when the optional dielectric cap 14 is not present. In some embodiments of the present disclosure, the ARC 16 can be omitted from the initial structure 10.

The ARC 16 employed has all of the following general characteristics: (i) It acts as an ARC during a lithographic patterning process; (ii) It withstands high-temperature BEOL integration processing (up to 500° C.); (iii) It prevents poisoning of at least one of the overlying layers that serve as a photoresist by the substrate; (iv) It provides vertical wall profile and sufficient etch selectivity between one of the overlying layers and the ARC layer; (v) It serves as a permanent dielectric layer in a chip (low dielectric constant, preferably k<5, more preferably k<3.6); and (vi) It is compatible with conventional BEOL integration and produces reliable hardware. Further discussion is now provided for characteristics (i)-(v).

Characteristic (i) the ARC 16 acts as an antireflective coating (ARC) during a lithographic patterning process: ARC 16 may be designed to control reflection of light that is transmitted through an overlying photoresist material, reflected off the substrate 12 and back into the photoresist material, where it can interfere with incoming light and cause the photoresist material to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm, 6.7 nm) radiation. The optical properties and thickness of the ARC 16 are optimized to obtain optimal resolution, profile control and to maximize the process window of the photoresist material during the subsequent patterning steps, which is well known to those ordinarily skilled in the art.

Characteristic (ii) ARC 16 can withstand high-temperature BEOL integration processing (up to 500° C.): ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents photoresist material poisoning by the substrate: At least the photoresist material employed herein includes a chemically amplified resist. The photoresist material can be poisoned by any basic contaminant from the underlying substrate, such as a SiCN cap layer. The ARC 16 must serve as a barrier layer to prevent basic contaminant from the underlying substrate from diffusing into the photoresist material to poison the same.

Characteristic (iv) ARC 16 provides vertical wall profile and sufficient etch selectivity between the photoresist material and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the photoresist material should be sufficient to prevent pattern collapse. ARC 16 should also be designed such that the etch selectivity during a subsequent ARC/cap open process is sufficiently high so that the opening of the ARC/cap stack does not erode a significant portion of the photoresist material and degrade significantly its pattern profile. An etch selectivity (etch rate ratio of ARC/cap versus photoresist material) is greater than 1, preferably greater than 3, more preferable greater than 5.

Characteristic (v) ARC 16 serves as a permanent dielectric layer in a chip: ARC 16 remains in the final interconnect structure as a permanent dielectric layer in a chip. Therefore, ARC 16 must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ $A/cm^2$, preferably less than $10^{-7}$ $A/cm^2$, and more preferably less than $10^{-9}$ $A/cm^2$); mechanical properties (adhesion energy is equal to or greater than the cohesive energy of the weakest layer of the integrated film stack); and the ARC employed must pass electrical and mechanical reliability tests.

The thickness of the ARC 16 may vary depending on the technique used to form the same as well as the material make-up of the layer. Typically, the ARC 16 has a thickness from 1 nm to 200 nm, with a thickness from 10 nm to 140 nm being more typical. The ARC 16 may be inorganic or a hybrid of inorganic and organic. The ARC 16 may be a single layer or multilayer. ARC 16 may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as ARC 16 and may be deposited, for example, by plasma-enhanced chemical vapor deposition, spin-on techniques, spray coating, dip coating, etc. ARC 16 may be a single layer or multilayer. When ARC 16 is a multilayer ARC, the deposition of each layer may be the same or a combination of deposition methods can be used. The chemical composition of ARC 16 may be uniform or graded along the vertical direction. After applying ARC 16 particularly those from a liquid phase, a post deposition baking step is usually required to remove unwanted components, such as solvent, and to effect crosslinking. The post deposition baking step of the ARC 16 is typically, but not necessarily always, performed at a temperature from 80° C. to 300° C., with a baking temperature from 120° C. to 200° C. being more typical.

In some embodiments, the as-deposited ARC may be subjected to a post deposition treatment to improve the properties of the entire layer or the surface of ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of ARC 16 and/or a film stack including ARC 16 and optional dielectric cap 14, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current. The conditions described above for the post treatment of the optional dielectric cap 14 may be used for the post treatment for the ARC.

In one embodiment, the ARC 16 that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described, for example, in U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, C and H are carbon and hydrogen element, respectively, and X is at least one element of O, N, S and F.

In one embodiment, ARC 16 is produced by a vapor or liquid phase deposition (such as, for example, CVD, PECVD, PVD, ALD and spin-on coating) method using appropriate precursors or combination of precursors containing elements described above.

In some embodiments, ARC 16 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane ($SiH_4$) derivatives having the molecular formula $SiR_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to, silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, $Si(Net)_4$, can be used as the silicon, carbon and nitrogen source. Another preferred method is a mixture of precursors, a Si containing source such as silane, disilane, or a alkylsilane such as tetramethylsilane, or trimethylsilane, and a nitrogen containing source such as ammonia, amines, nitriles, aminos, azidos, azos, and hydrizos. An additional carbon source and/or carbon and nitrogen containing source comprised of a linear, branched, cyclic or polycyclic hydrocarbon backbone of $—[CH_2]_n—$, where n is greater than or equal to 1, and may be substituted by functional groups selected from alkenes (—C═C—), alkynes (—C≡C—), amines (—C—N—), nitriles (—C≡N), amino (—$NH_2$), azido (—N═N═N—) and azo (—N═N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of ARC 16. Broadly, the conditions used for providing ARC 16 that contain the elements Si:C:H:X, include: setting the substrate temperature within a range from 100° C. to 700° C.; setting the high frequency RF power density within a range from 0.1 W/$cm^2$ to 2.0 W/$cm^2$; setting the gas flow rates within a range from 5 sccm to 10000 sccm; setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 sccm to 1000 sccm. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in the ARC are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in the ARC are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in the ARC are as follows: preferably O atomic % to 70 atomic %, more preferably 0.5 atomic % to 70 atomic %, most preferably 1 atomic % to 40 atomic % and most highly preferably 5 atomic % to 30 atomic %.

ARC 16 including elements of M, C and H may have a tunable index of refraction and extinction coefficient which can be optionally graded along the film thickness to match the optical properties of the substrate and the photoresist to be formed directly on it. Thus, the optical properties and the lithographic features of the ARC 16 are superior to those obtained by a conventional single layer ARC. The ARC's optical constants are defined here as the index of refraction n and the extinction coefficient k.

ARC 16 including elements of M, C and H can be deposited also in a parallel plate PECVD reactor with the substrate positioned on the grounded electrode. In some embodiments, the ARC 16 can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films.

In another embodiment, the ARC 16 that is employed is formed by a liquid deposition process including, for example, spin-on coating, spray coating, dip coating, brush coating, evaporation or chemical solution deposition. The ARC formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC 16 formed by liquid deposition may also include at least one second monomer unit, in addition to the at least one monomer unit represented by the formula M-$R^A$. When present, the at least one second monomer unit has the formula M', —$R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising M-$R^A$ or M-$R^A$ and M'—$R^B$ may also comprise at least one additional component, including a separate crosslinker, an acid generator or a solvent. When liquid deposition is employed, the ARC is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of an inorganic ARC composition used in the liquid deposition embodiment comprises M-$R^A$ and M'—$R^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the $MO_y$ unit which can be any one of many different metal-oxide forms. An exemplary list of such metal-oxide forms for a particular metal is as follows: $MO_3$; wherein M is Sc, Y, lanthanide, and Group IIIA; B, Al, Ga or In; $MO_4$; wherein M is Group IVB; Ti, Zr or Hf, and Group IVA; Sn or Ge; $MO_5$; wherein M is Group VB; V, Nb or Ta; or P. The Group VB metals are also known to form stable metal oxo forms, $LMO_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following embodiment. In one embodiment, the ARC 16 formed by liquid deposition is characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should be soluble to form a solution and have film-forming characteristics conducive to forming ARC 16 by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

(I)

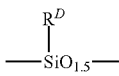
(II)

where $R_C$ comprises a chromophore and $R^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for $R^C$-containing monomers may be represented as structure (III) below and the average structure for $R^D$-containing monomers may be represented by structure (IV) below:

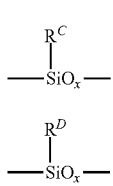
(III)

(IV)

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups $R^C$ (or $R^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC is poly (4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly (p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly (p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC preferably have a weight average molecular weight, before reaction with the cross-linking component, of at least 1000, more preferably a weight average molecular weight of 1000-10000.

The cross-linking component of the liquid deposited ARC is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective coating compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

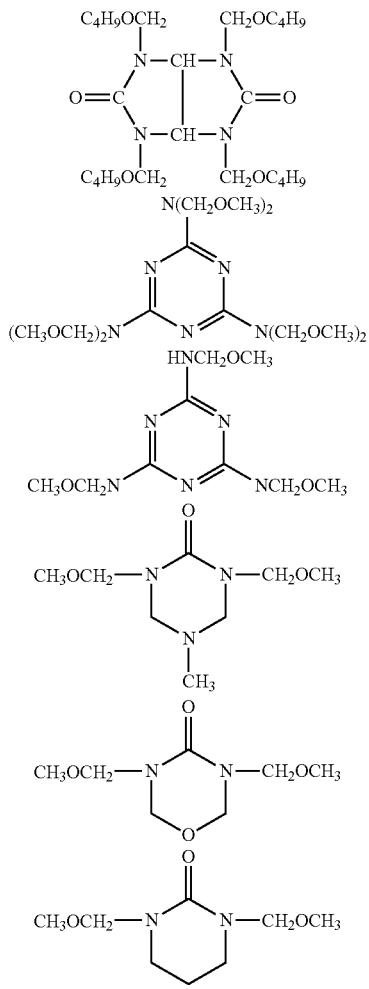

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective coating compositions used in the liquid deposition process preferably contain (on a solids basis) in a suitable solvent commonly known to those skilled in the art (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC 16, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present disclosure. The baked and previously liquid deposited ARC may further undergo a post curing treatment process. This post curing treatment may include one of the post treatments used above for the optional dielectric cap. As such, the various post treatments and conditions used above in treating the optional dielectric cap are incorporated herein by reference.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, the ARC 16 can be modeled so as to find optimum optical parameters (n and k values) of ARC as well as optimum thickness. The preferred optical constants of the ARC are in the range from n=1.4 to n=2.6 and k=0.01 to k=0.78 at a wavelength of 248, 193 and 157, 126 nm and extreme ultraviolet (13.4 nm) radiation.

In addition to the above, the ARC 16 in any embodiment has good etch selectivity during pattern transfer. Etch selectivities of 1.5-4 to 1 of the ARC 16 to cured dielectric materials can be obtained. Furthermore, the use of the ARC 16 as described above (vapor or liquid deposited) maintains the pattern and structural integrity after curing of the patterned dielectric materials. This is critical as the ARC 16 is retained as a permanent part of the final interconnect stack.

In some embodiments, the optional dielectric cap 14 and the ARC 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

Figure 2:
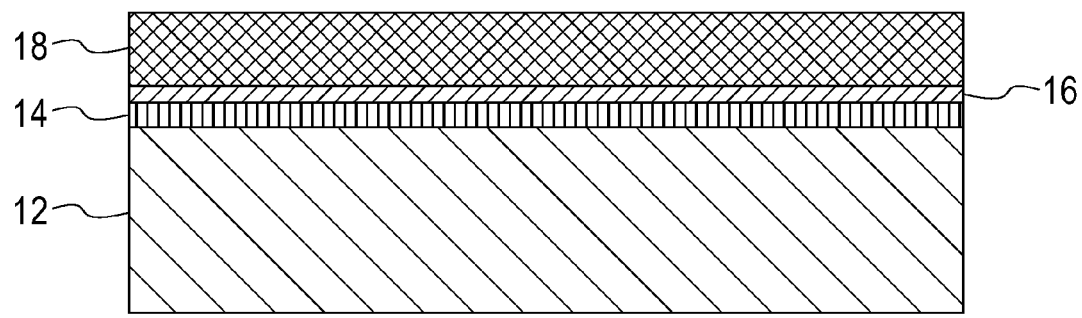
FIG. 2 is a pictorial representation (through a cross sectional view) illustrating the initial structure of FIG. 1 after forming a photoresist on an upper surface of the initial structure.

Referring now to FIG. 2, there is illustrated the initial structure 10 of FIG. 1 after forming a photoresist 18 on an upper surface of the initial structure. In the particular embodiment illustrated, the photoresist 18 is formed directly on an upper surface of ARC 16. Photoresist 18 can include any conventional chemically amplified photoresist material that is well known to one skilled in the art. Photoresist 18 may be a negative-tone photoresist material or a positive-tone photoresist material. These chemically amplified photoresists generate a strong acid to catalyze the deproetection or the cros slinking of the photoresist polymer after exposure to an irradiation source and baking. This photo-generated acid will be employed herein to form self-aligned sidewall patterns of permanent patterned dielectric structures.

The photoresist 18 (negative-tone or positive-tone) that is employed is present in a composition that includes, in addition to the photoresist material, a photoacid generator, a base additive and a solvent. When the photoresist 18 is a negative-tone photoresist material, it may be formed from a composition optionally including an additional cross-linker. By "negative-tone" it is meant that the part of the photoresist that is exposed to an actinic irradiation will not be removed by a conventional developer, while the unexposed part of the photoresist is removed. When the photoresist 18 is a positive-tone photoresist material, it is formed from a composition that includes a photoresist material that contains at least photo/acid imageable functional groups to form positive-tone patterns, a photoacid generator, a base additive and a solvent. By 'positive-tone" it is meant that the part of the photoresist that is exposed to an actinic irradiation will be removed by a conventional developer, while the unexposed part of the photoresist is not removed. The photoacid generators, base additives and solvents are well known to those skilled in the art and, as such, details regarding those components are not fully provided.

The photoresist 18 is typically applied to an upper most surface of the initial structure 10 utilizing a conventional deposition process including, but not limited to, spin-on coating, dip coating, brushing, evaporation, blade coating, ink jet dispensing, chemical vapor deposition, and plasma enhanced chemical vapor deposition. In some embodiments, the as-deposited photoresist 18 can be subjected to a post deposition baking step to remove any unwanted components such as solvent from the applied photoresist. When such a post deposition baking step is employed, the post deposition baking step is performed at a temperature from 40° C. to 200° C., with a temperature from 60° C. to 140° C. being more typical. The duration of the post deposition baking step varies from 10 seconds to 600 seconds and is not critical herein.

The thickness of photoresist 18 may vary depending on the type of photoresist material employed as well as the type of deposition process that is used in forming the same. Typically, photoresist 18 has a thickness from 1 nm to 50000 nm, with a thickness from 10 nm to 5000 nm being more typical.

Figure 3:
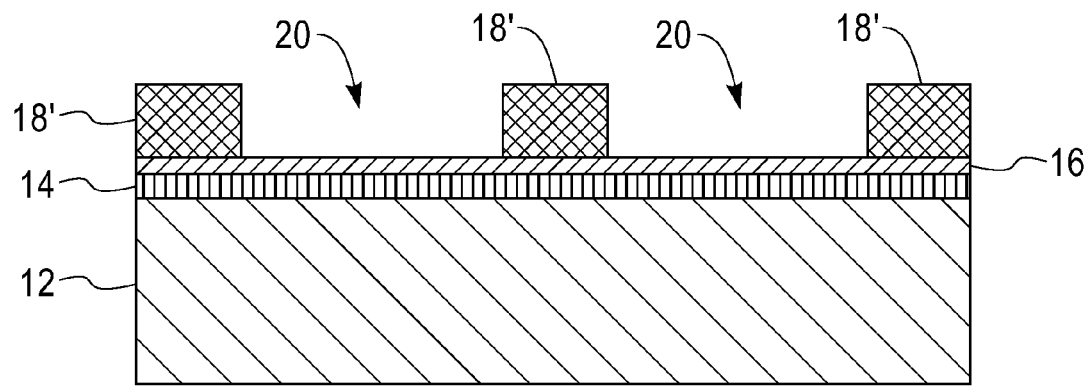
FIG. 3 is a pictorial representation (through a cross sectional view) illustrating the structure of FIG. 2 after forming at least one opening within the photoresist.

Referring now to FIG. 3, there is illustrated the structure of FIG. 2 after patterning the photoresist 18 to form latent images of a desired circuitry. In FIG. 3, reference numeral 18' is used to denote the patterned photoresist, and reference numeral 20 is used to denote the at least one opening (i.e., interconnect pattern) that is formed by this pattern-wise exposure step. An optional post-exposure baking step may be required to effect a desired photochemical reaction. When performed, the post-exposure baking step is conducted at a temperature from 60° C. to 200° C., with a post-exposure baking temperature from 80° C. to 140° C. being more typical. The duration of the post-exposure baking step varies and is not critical herein. After exposure and post-exposure baking, the latent images are developed into the relief images with an appropriate developer, usually an aqueous base solution, such as 0.26N tetramethylammoniahydroxide (TMAH) solution.

The pattern wise exposing process can be accomplished in a variety of ways, including, for example, through a mask with a lithography stepper or a scanner with an exposure light source of G-line, Mine (365 nm), DUV (248 nm, 193 nm, 157 nm, 126 nm), Extreme UV (13.4 nm, 6.7 nm), an electron beam, or an ion beam. The exposing process may be performed in a dry mode or an immersion mode. The pattern-wise exposing process also includes direct writing without the use of a mask with, for example, light, electron beam, ion beam, and scanning probe lithography.

As stated above and as illustrated in FIG. 3, the patterned photoresist 18' includes at least one opening 20 therein. As shown, the at least one opening 20 exposes an upper surface, e.g., the ARC 16, of the initial structure 10.

As stated previously, the exposure of the chemically amplified photoresist and subsequent baking generate a strong acid from the photoacid generator of the photoresist composition. The residual acid on the sidewall of the photoresist patterns can catalyze cros slinking of the dielectric coating material to be applied later on.

In some embodiments of the present disclosure, a thin protective layer (not shown) can be formed atop the patterned photoresist. This thin protective layer functions to protect the pattern, the size, the shape and other features of the patterned photoresist during the subsequent steps of applying the dielectric coating material. When present the protective layer can be formed utilizing a conventional deposition process such as, for example, spin coating, dip coating, spray coating, chemical vapor deposition, plasma enhanced chemical vapor deposition, chemical solution deposition, or evaporation. The thickness of the protective layer is typically $1/10000$ to $1/5$ the width of the opening of the photoresist pattern, with a thickness from $1/1000$ to $1/10$ the width of the opening of the photoresist pattern being more typical In other embodiments, a thin protective layer (not shown) is formed atop the photoresist pattern by treatment of the photoresist pattern. This surface treatment of the photoresist pattern can be irradiation to an electromagnetic wave, such as a UV light source of a wavelength shorter than 200 nm, plasma treatment or chemical treatment from a vapor or a liquid phase. This surface treatment serves to harden at least the upper surface of the patterned photoresist.

Figure 4:
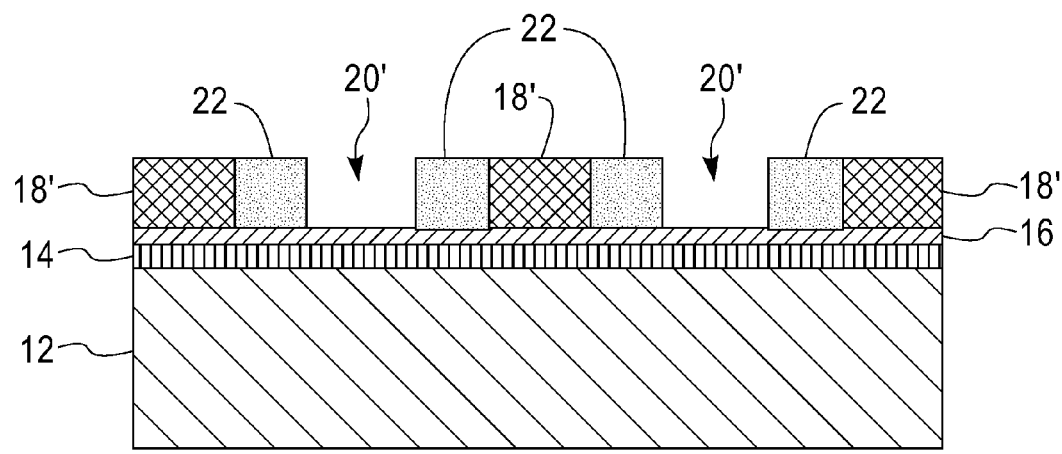
FIG. 4 is a pictorial representation (through a cross sectional view) illustrating the structure of FIG. 3 after forming dielectric sidewall structures within the at least one opening and on sidewalls of the patterned photoresist, wherein a narrowed width opening is present between neighboring dielectric sidewall structures.

Referring now to FIG. 4, there is illustrated the structure of FIG. 3 after forming dielectric sidewall structures 22 within the at least one opening 20 and on sidewalls of the patterned photoresist 18'. The dielectric sidewall structures 22 are formed by first overfilling the at least one opening 20 with a dielectric coating material. The dielectric coating material that can be employed includes any dielectric material that can be crosslinked with an acid and form a dielectric material upon subsequent curing. More particularly, the dielectric coating material comprises a polymer, copolymer, or blend of polymers and/or copolymers having at least one reactive group. The thickness of the dielectric coating may vary depending on the requirement of the chip and the technique used to form the same as well as the material make-up of the layer. Typically, the dielectric coating material has a thickness that is greater than the thickness of the patterned photoresist 18'. The dielectric coating material can be formed by any conventional deposition process including, for example, those mentioned above for forming photoresist 18.

The cured product of the dielectric coating material can serve as an permanent on-chip dielectric insulator. The dielectric coating material employed herein can be deposited from a liquid phase. In the present disclosure, the terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of the dielectric coating material is the product of the dielectric coating material after it has undergone one of the aforementioned cure processes. The "cured" product of a dielectric coating material is different from the originally deposited dielectric coating material in chemical nature and physical, mechanical and electrical properties.

The dielectric coating material that can be employed includes a functionalized polymer, copolymer or blend including at least two of any combination of polymers and/or copolymers having one or more acid-sensitive imageable groups. After curing, the dielectric coating material is converted into a permanent on-chip dielectric material having a dielectric constant of about 7 or less. It is noted that when the dielectric coating material is comprised of a polymer, the polymer includes at least one monomer (to be described in greater detail below). When the dielectric coating material is comprised of a copolymer, the copolymer includes at least two monomers (to be described in greater detail below). The blends of polymers and/or copolymers include at least two of any combination of polymers and/or copolymers described below.

In general terms, the dielectric coating material is a composition including a polymer, a copolymer, or a blend including at least two of any combination of acid-sensitive polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the dielectric coating material that can be employed is a composition comprising an acid-sensitive polymer of one monomer or a copolymer of at least two monomers selected from siloxane, silane, carbosilane, oxycarbosilane, organosilicates, silsesquioxanes and the like. The dielectric coating material may also be a composition comprising a polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the dielectric coating material may comprise a blend including at least two of any combination of acid-sensitive polymers and/or copolymers, wherein the said polymers include one monomer and the said copolymers include at least two monomers and wherein the monomers of the said polymers and the monomers of the said copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the dielectric coating material may be a composition further comprising at least one microscopic pore generator (porogen). The pore generator may be or may not be acid sensitive.

Illustrative polymers for the dielectric coating material include, but are not limited to, siloxane, silane, carbosilane, oxycarbosilane, silsesquioxane-type polymers including caged, linear, branched or combinations thereof. In one embodiment, the dielectric coating material is a photo-patternable low k (PPLK) composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009 all of which are incorporated herein by reference in their entirety. When a PLLK material is employed as the dielectric coating material, a protective layer is typically present atop the patterned photoresist, or the patterned photoresist has a surface region that is hardened.

The dielectric coating material is formed from a composition that includes at least one of the above mentioned polymers, copolymers or blends and a solvent that is typically compatible with the underlying photoresist patterns. By "compatible with", it is meant that the application of the dielectric coating material composition directly over the photoresist patterns does not substantially alter the size, the shape, and other features of the photoresist patterns. This solvent may be hydrocarbon, alcohol, water or a mixture thereof. In some embodiments, the dielectric coating material may be formed from a composition that optionally includes an additional cross-linker.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The solvents that are used in the dielectric coating material composition that are compatible with the underlying photoresist patterns include organic solvents such as hydrocarbons and alcohols, and water or a mixture thereof.

When the solvent of the dielectric composition is not compatible with the photoresist pattern, a thin protective layer may be formed on the surface of the photoresist pattern as described previously to maintain the pattern integrity of the photoresist pattern.

The dielectric coating material can be formed utilizing a deposition process including, for example, spin-on-coating, dip coating, spray coating, brush coating, blade coating, and ink-jet dispensing. After applying the dielectric coating material a post deposition baking step is typically, but not necessarily always, required to remove unwanted components, such as solvent. When performed, the baking step can be conducted at a temperature from 40° C. to 200° C., with a baking temperature from 60° C. to 140° C. being more typical. The duration of the baking step varies from 10 seconds to 600 seconds and is not critical herein.

After overfilling the at least one opening 20 with the dielectric coating material, the structure is subjected to a baking step that causes diffusion of residual acid from the sidewalls of the patterned photoresist 18' into the neighboring sidewall portions of the dielectric coating material and subsequent crosslinking with the neighboring sidewall portions of the dielectric coating material occurs. The baking step is performed at a temperature from 40° C. to 200° C., with a temperature from 60° C. to 140° C. being more typical. The duration of the baking step may vary depending on the type of dielectric coating material and photoresist employed. Typically, the duration of the baking step is from 1 second to 3600 second, with a duration from 30 second to 180 seconds being more typical.

After the baking step, a rinsing step is performed that removes at least portions of the dielectric coating material that are not crosslinked providing the dielectric sidewall structures 22 as illustrated in FIG. 4. The rinsing step that can be employed includes any solvent or solution that is capable of removing the non-crosslinked portions of the dielectric coating material relative to the crosslinked, i.e., dielectric sidewall structures 22. Examples of solutions that can be employed in this rinsing step include, but are not limited to, the solvent of the dielectric composition, such as a hydrocarbon, alcohol, water or a mixture thereof. This rinsing step also removes the over-coating of the dielectric material coating on top of the patterned photoresist.

It is observed that after forming the dielectric sidewall structures 22 within the at least one opening, at least a new opening is formed with a width narrower (herein after referred to as narrowed width opening 20') than that of the parent opening 20 within the patterned photoresist. See FIG. 4 as well. The at least one narrowed width opening 20' has a width that is less than the width of the original at least one opening 20. Typically, the at least one narrowed width opening 22' has a width from 99.9% to 1.0% of the width of the parent opening 20, with a width from 70% to 30% being more typical. The size of the narrowed width opening 20' can be the same as or different from the size of the photoresist pattern 18'. In some embodiments of the present disclosure, the width of each narrowed width opening 20' is the same. In other embodiments of the present disclosure, the width of the narrowed width openings can be different. The width of each narrowed width opening 20' that is formed depends on the width of the dielectric sidewall structures formed.

After providing the dielectric sidewall structures 22 as shown in FIG. 4, the patterned photoresist 18' is removed from the structure utilizing any conventional stripping process including, for example, ashing. In another embodiment, the patterned photoresist 18' is removed by blanket exposure to irradiation and baking, followed by developing with a photoresist developer, such as TMAH. The removal of the patterned photoresist 18' provides additional second openings 21 between neighboring dielectric sidewall structures 22. The width of the additional second openings 21, which is dependent on the width of the patterned photoresist 18', can be the same or different as that of the narrowed width opening 20'. See FIG. 5.

In some embodiments and prior to curing the dielectric sidewall structures, it is possible to open the underlying exposed portions of the ARC 16 and the optional dielectric cap 14 and then fill the narrowed width opening with at least one electrically conductive material. This particular embodiment is not however shown in the drawings of the present disclosure. Also, the details concerning the opening of the ARC 16 and the optional dielectric cap 14 and the filling of the various openings with at least one electrically conductive material are the same as described herein below for the specific embodiment illustrated within the drawings of the present application.

Figure 5:
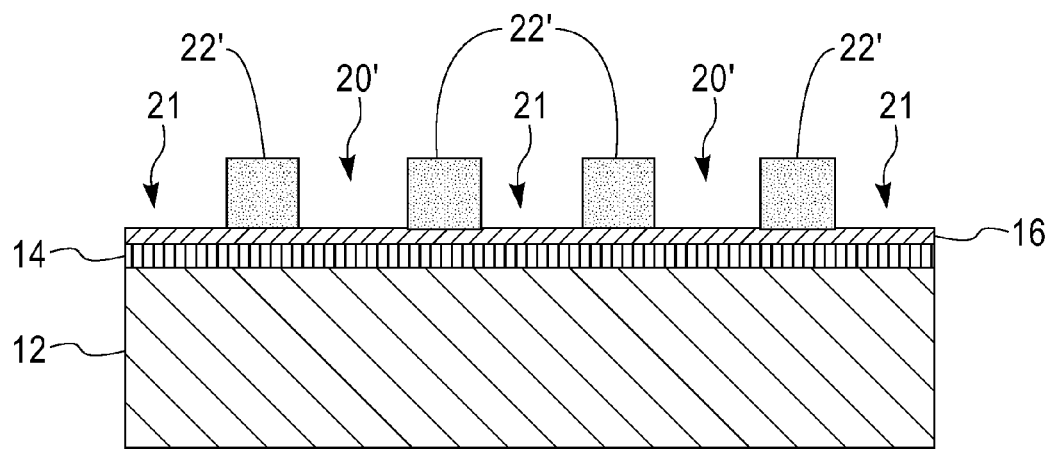
FIG. 5 is a pictorial representation (through a cross sectional view) illustrating the structure of FIG. 4 after removing the patterned photoresist and converting the dielectric sidewall structures into permanent low k structures.

Referring to FIG. 5, there is illustrated the structure that is formed after removing the patterned photoresist 18' and converting the dielectric sidewall structures 22 into permanent patterned dielectric structures 22' (e.g., self-aligned double patterned permanent dielectric structures). The removal of the patterned photoresist has been described above. The converting of the dielectric sidewall structures 22 into permanent patterned dielectric structures 22' is performed by a curing process including, for example, a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the dielectric sidewall structures into a permanent on-chip dielectric and maintains pattern fidelity.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He and Ar. Typically, the UV/thermal cure temperature is from 100° C. to 500° C., with a cure temperature from 300° C. to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials.

In some embodiment, the dielectric material cure may be in different or the same tool cluster as that used in forming the dielectric sidewall structures 22.

Figure 6:
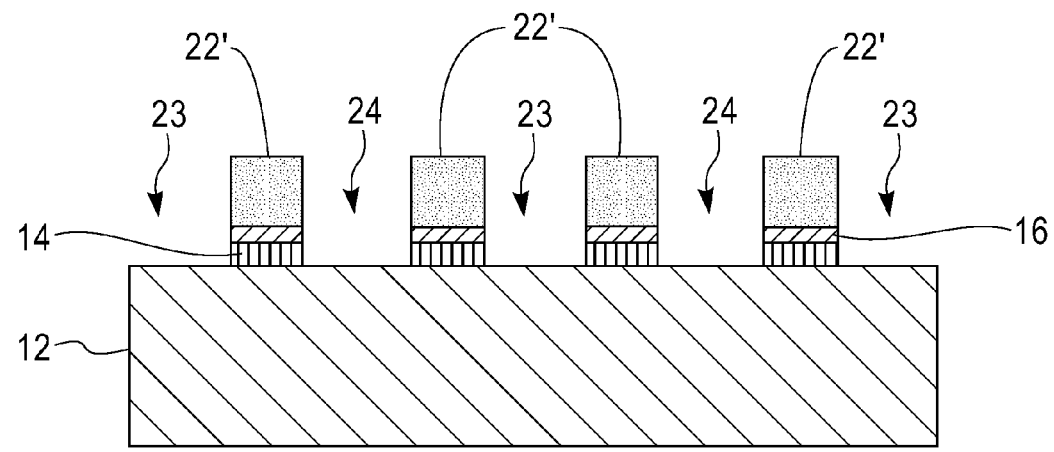
FIG. 6 is a pictorial representation (through a cross sectional view) illustrating the structure of FIG. 5 after extending the at least one narrowed width opening into at least a portion of the initial structure.

Referring to FIG. 6, there is illustrated the structure that is formed after extending the additional openings 21 and the at least one narrowed width opening 20' into underling exposed portions of the ARC 16 and, if present, the optional dielectric cap 14. This step of the present disclosure used to 'open' the ARC 16 and, if present, the optional dielectric cap 14, includes any etching process such as, for example, plasma etching reactive ion etching or gas cluster ion beam etching. The extended openings (21 and 20') are labeled as reference numeral 23 and 24, respectively, in the drawings. The extending openings 23 and 24 may each have the same width or different widths.

Figure 7:
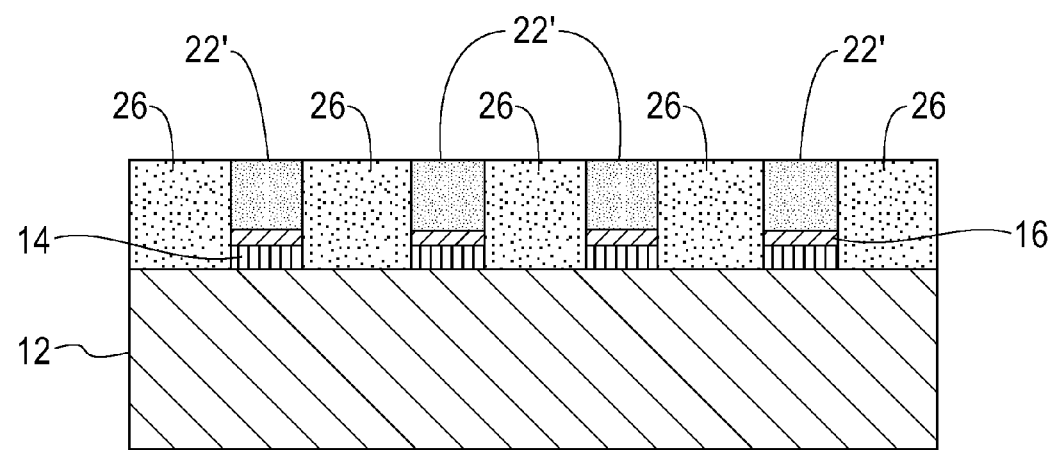
FIG. 7 is a pictorial representation (through a cross sectional view) depicting the structure of FIG. 6 after forming an electrically conductive material within the extended at least one narrowed width opening.

Referring now to FIG. 7, there is illustrated the structure of FIG. 6 after forming at least an electrically conductive material within the extended openings 23 and 24. In some embodiments, a diffusion barrier layer (liner) (not shown), which may comprise Ta, TaN, Ti, TiN, Ru, RuTaN, RuTa, W, WN or any other material that can serve as a barrier to prevent the electrically conductive material from diffusing through, is typically formed into the extended opening 23 prior to filling the same with an electrically conductive material. When present the diffusion barrier layer is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 7 to 20 nm being more typical.

Following the formation of the diffusion barrier layer (liner), the remaining extended openings 23 and 24 are filled with an electrically conductive material 26 forming a conductive feature. The electrically conductive material 26 used in forming the conductive feature includes, for example, polySi, an electrically conductive metal, an alloy comprising at least one electrically conductive metal, an electrically conductive metal silicide, an electrically conductive nanotube or nanowire, graphene or combinations thereof. Preferably, the electrically conductive material 26 that is used in forming the conductive feature is a conductive metal such as Cu, W or Al, with Cu or a Cu alloy (such as AlCu) being highly preferred in the present invention. The electrically conductive material 26 is filled into the remaining openings utilizing a conventional deposition process including, but not limited to CVD, PECVD, sputtering, chemical solution deposition or plating. A preferred filling method is electrochemical plating. The size of the electrical conductive material 26 can be the same or different on this same interconnect level.

After deposition, a conventional planarization process such as, for example, chemical mechanical polishing (CMP) can be used to provide a structure in which the diffusion barrier layer and the electrically conductive material 26 each have an upper surface that is substantially coplanar with the upper surface of the permanent patterned dielectric structures 22'. The resultant structure after electrically conductive material fill and planarization is shown, for example, in FIG. 7. It is noted that in this embodiment, it is also possible to form different sized conductive features within the permanent patterned dielectric structures 22'.

After forming the structure shown in FIG. 7, another dielectric cap (not shown) can be formed on the upper surfaces of each of the permanent patterned dielectric structures 22' as well as atop an upper surface of the electrically conductive material 26. The another dielectric cap can be formed utilizing the methods described above for optional dielectric cap 14 and the another dielectric cap can comprise the same or different composition as the optional dielectric cap 14.

Reference is now made to FIGS. 8-15 which illustrate another embodiment of the present disclosure. In particular, FIGS. 8-15 represent a method of forming a dual damascene structure. It is noted that in this embodiment, it is also possible to form different sized conductive features within a patterned dielectric material (i.e., permanent patterned dielectric structures 22').

Figure 8:
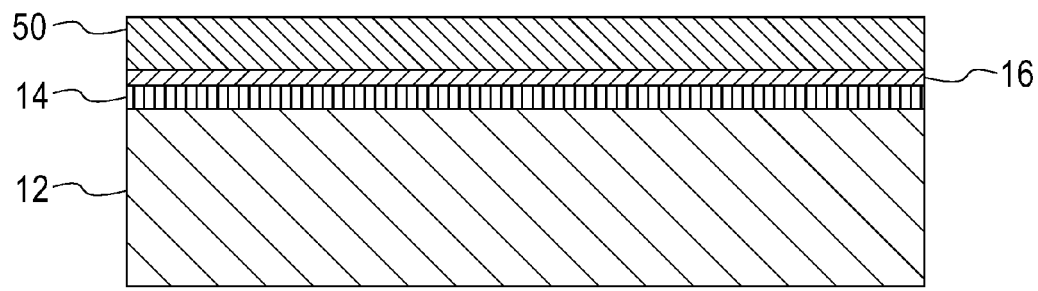
FIG. 8 is a pictorial representation (through a cross sectional view) illustrating the initial structure of FIG. 1 after forming a dielectric material on the upper most surface of the initial structure in accordance with another embodiment of the present disclosure.

This embodiment of the present disclosure begins by first providing the initial structure 10 as shown FIG. 1. After providing the initial structure 10, a dielectric material 50 (as shown in FIG. 8) is formed on an upper most surface of the initial structure 10. The dielectric material 50 includes any interlevel or intralevel dielectric material. The dielectric material 50 that is formed on the upper most surface of the initial structure can have a dielectric constant about 4.3 or less, typically less than 3.8. Illustrative examples of dielectric materials that can be employed include, but are not limited to, silicon oxide, silsesquioxanes, C doped oxides (i.e., organosilicates) that include atoms of Si, C, O and H, thermosetting polyarylene ethers, and doped silicate glass materials. The term "polyarylene" is used in this disclosure to denote aryl moieties or inertly substituted aryl moieties which are linked together by bonds, fused rings, or inert linking groups such as, for example, oxygen, sulfur, sulfone, sulfoxide, carbonyl and the like.

The thickness of the dielectric material 50 may vary depending on the type of dielectric material employed as well as the technique that was used in forming the same. Typically, the dielectric material 50 has a thickness from 5 nm to 2 μm, with a thickness from 10 nm to 500 nm being more typical. The dielectric material 50 can be formed utilizing any conventional deposition process including, but not limited to, chemical vapor deposition, plasma enhanced chemical vapor deposition, evaporation, chemical solution deposition and spin-on coating.

Figure 9:
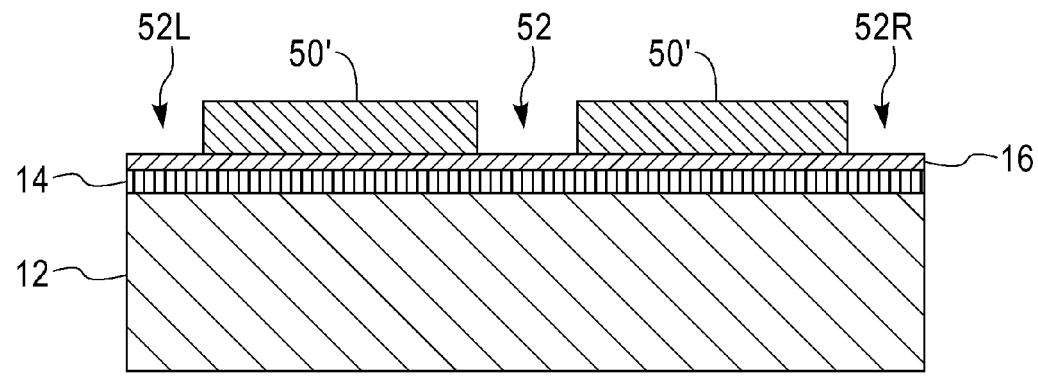
FIG. 9 is a pictorial representation (through a cross sectional view) illustrating the structure of FIG. 8 after patterning the dielectric material into a patterned dielectric material having a plurality of first openings therein.

After providing the dielectric material 50 to the initial structure 10, the dielectric material 50 is patterned to include a plurality of first openings, e.g., interconnect patterns. In FIG. 9, reference numerals 52L, 52 and 52R denote some of the plurality of first openings that can be formed. Such a structure including patterned dielectric material 50' and the various first openings is shown, for example, in FIG. 9. The patterning of the dielectric material 50 into patterned dielectric material 50' may include a conventional lithography process (including the one mentioned above for patterning the photoresist 18) and etching (including dry etching and/or wet chemical etching). This patterning method is well known to those skilled in the art.

The plurality of first openings, e.g., 52L, 52 and 52R shown in the drawings, can be a via opening or a trench opening. In a preferred embodiment, and as shown, each of the first openings, e.g., first openings 52L, 52 and 52R, is a via opening.

Figure 10:
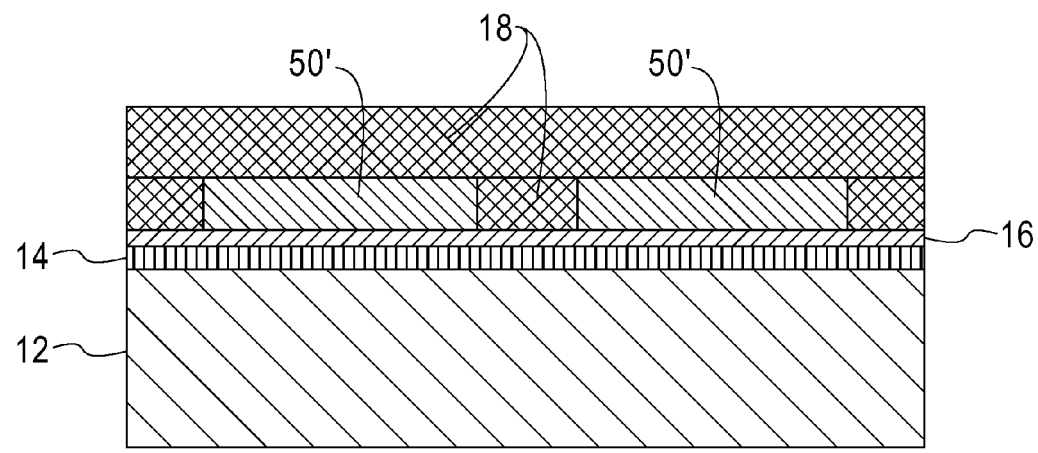
FIG. 10 is a pictorial representation (through a cross sectional view) illustrating the structure of FIG. 9 after forming a photoresist on the patterned dielectric material and within at least one of said plurality of first openings in said patterned dielectric material.

Referring now to FIG. 10, a photoresist 18 which is chemically amplified is formed on top of the patterned dielectric material 50' and within each of the first openings, e.g., first openings 52L, 52 and 52R. The photoresist 18 used in this embodiment is the same as that used for photoresist 18 in the first embodiment.

Figure 11:
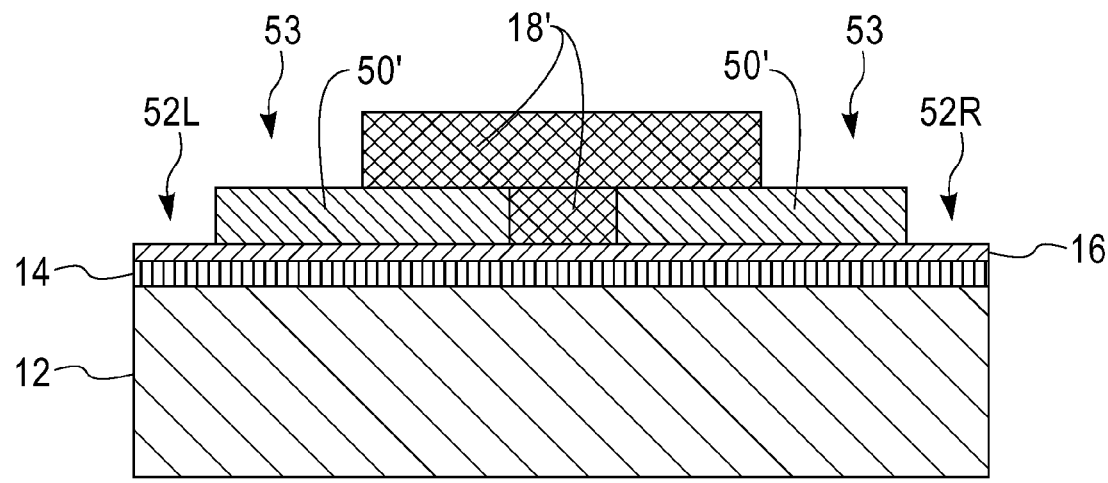
FIG. 11 is a pictorial representation (through a cross sectional view) illustrating the structure of FIG. 10 after patterning the photoresist, wherein second openings are present in the patterned resist.

Referring now to FIG. 11, there is shown the structure of FIG. 10 after patterning the photoresist 18 into a patterned photoresist 18' having second openings 53. As is illustrated, a portion of the patterned photoresist 18' remains in at least one of the first openings, e.g., first opening 52 shown in FIG. 10. While some of the patterned photoresist 18' remains in at least one of the first openings (e.g., first opening 52), the photoresist 18 is removed from some of the first openings (e.g., first openings 52L and 52R) not including the patterned photoresist. The patterning of the photoresist 18 into a patterned photoresist 18' is performed utilizing the same method used in the first embodiment. The portion of the patterned photoresist that is located atop the patterned dielectric material 50' has a width that differs from the width of first opening 52. In one embodiment, and as illustrated, the width of the portion of the patterned photoresist 18' atop the patterned dielectric material 50' is greater than the width of first opening 52 within the patterned dielectric material 50'. In such an embodiment, the first opening 52 is a via opening, and the width of the portion of the patterned photoresist 18' atop the patterned dielectric material 50 is a width of a trench opening. In other embodiments, the first opening 52 is a trench opening and the width of the portion of the patterned photoresist 18' atop the patterned dielectric material 50' is a width of a via opening. It is observed the second openings 53 are located atop and connected with first openings 52L and 52R.

Figure 12:
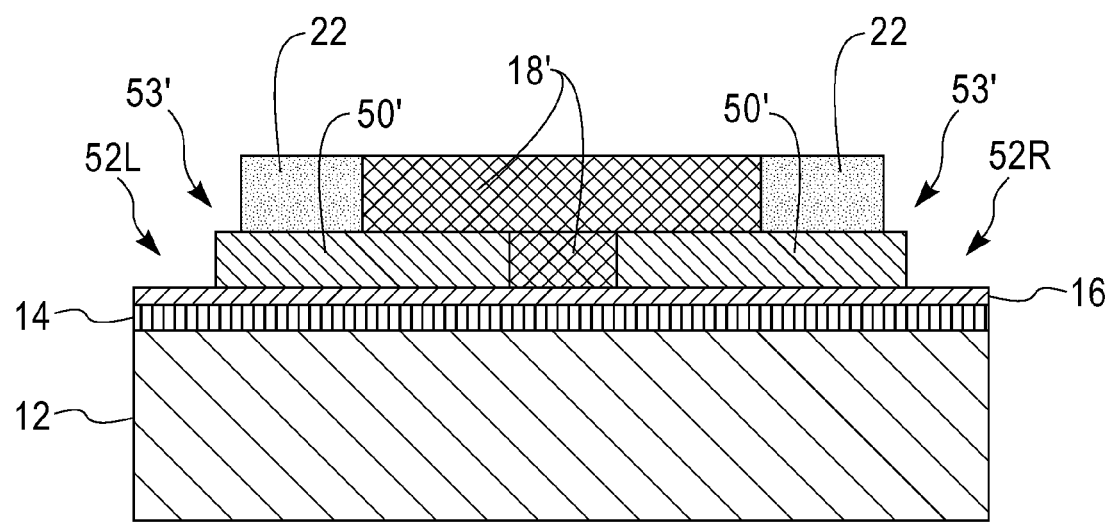
FIG. 12 is a pictorial representation (through a cross sectional view) illustrating the structure of FIG. 10 after forming dielectric sidewall structures on sidewalls of the patterned photoresist, wherein the dielectric sidewall structures narrow the width of the second openings providing narrowed width second openings.

Referring now to FIG. 12, there is illustrated the structure of FIG. 11 after forming dielectric sidewall structures 22 on sidewalls of the patterned photoresist 18'. The dielectric sidewall structures 22 include one of the dielectric coating materials mentioned in the first embodiment and the dielectric sidewall structures are also formed as described above. The formation of dielectric sidewall structures 22 on sidewalls of the patterned photoresist 18' narrows the width of each second opening 53 providing narrowed width second openings 53'. The size of each narrowed width second opening 53' can be the same or different.

Figure 13:
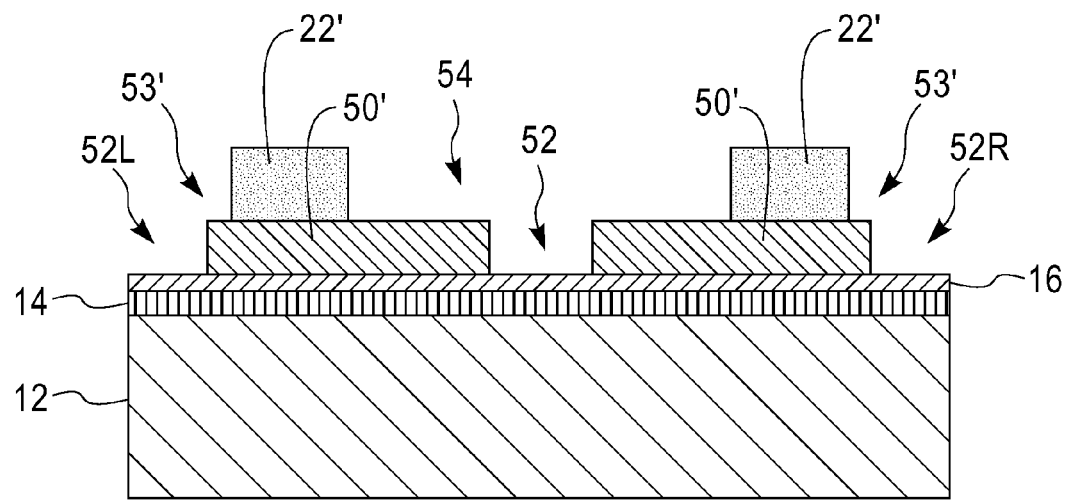
FIG. 13 is a pictorial representation (through a cross sectional view) illustrating the structure of FIG. 12 after removing the patterned photoresist and converting the dielectric sidewall structures into permanent patterned dielectric structures.

Referring now to FIG. 13, there is shown the structure of FIG. 12 after removing the patterned photoresist 18', and converting each of the dielectric sidewall structures 22 into a permanent patterned dielectric structure 22'. The removal of the patterned photoresist 18' and the converting of the dielectric sidewall structures 22 to permanent patterned dielectric structures 22' include the same techniques as mentioned above in the first embodiment of this disclosure. This removal of the patterned photoresist 18' also recovers the first opening 52. The removal of the patterned photoresist 18' also forms a third opening 54 between neighboring permanent patterned dielectric structures that is connected to the first opening 52. In some embodiments, the converting step can also be used to cure the patterned dielectric material 50' as well. The method of removal of the patterned photoresist 18' is the same as the one used the first embodiment. The narrowed width second openings 53' are located atop and are in contact with the first openings 52L and 52R, while the third opening 54 is located atop and is connected with the first opening 52. The sizes of the first, the narrowed width second and the third openings can be the same or different.

Figure 14:
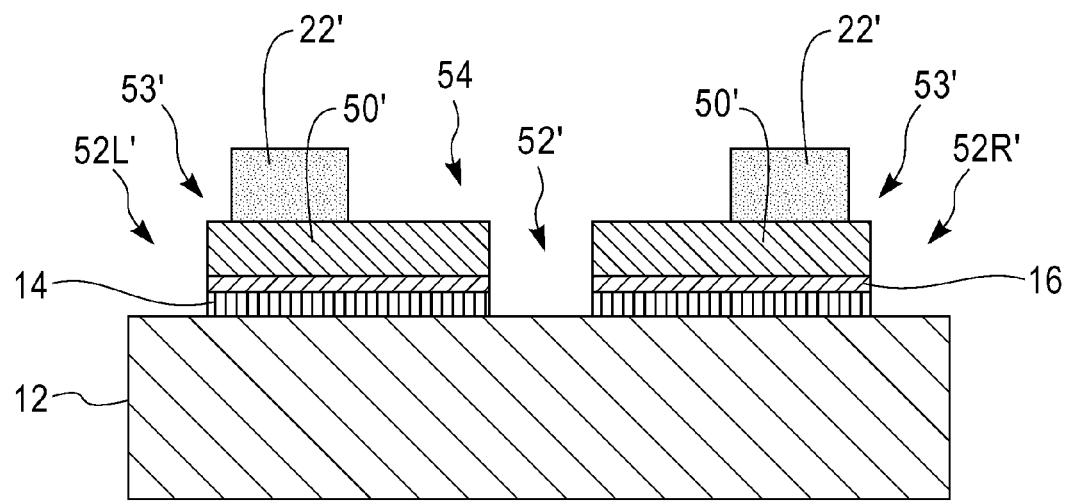
FIG. 14 is a pictorial representation (through a cross sectional view) illustrating the structure of FIG. 13 after etching exposed portions of the initial structure.

Referring now to FIG. 14, there is shown the structure of FIG. 13 after etching exposed portions of the ARC 16 and optional dielectric cap 14. The opening of the ARC 16 and optional dielectric cap 14 is the same as that described above in the first embodiment. In FIG. 14, reference numerals 52L', 52' and 52R' are used to denote extended first openings that are formed after opening the ARC 16 and the optional dielectric cap 14.

Figure 15:
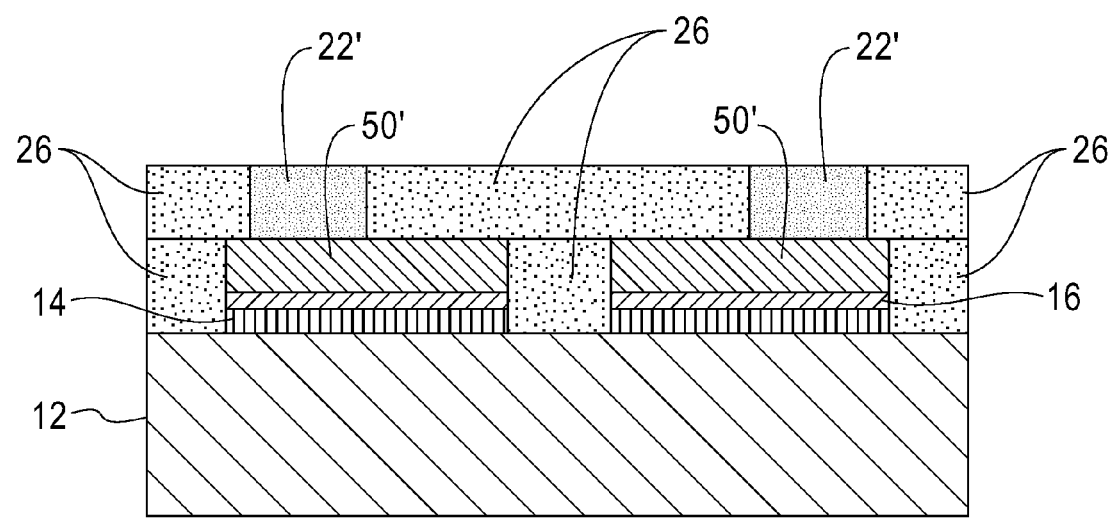
FIG. 15 is a pictorial representation (through a cross sectional view) illustrating the structure of FIG. 14 after filling the various openings with at least an electrically conductive material.

Referring now to FIG. 15, there is shown the structure of FIG. 14 after filling each of the various openings with at least an electrically conductive material. The processing used to fill the openings is the same as that described in the first embodiment. In some embodiments, and prior to filling with the electrically conductive material a diffusion barrier layer (as described above in the first embodiment) can be formed within the openings.

After providing the structure shown in FIG. 15, another dielectric cap (as described above in the first embodiment) can be formed atop the upper exposed surface of the structure.

It is noted that in some embodiments of the methods disclosed above, it is possible to form interconnect structures that include at least one patterned dielectric layer (i.e., element 22') located on a substrate (i.e., element 12), wherein said at least one patterned dielectric layer (i.e., element 22') includes differently sized conductive features (i.e., element 26) therein embedded therein. The differently sized conductive features are laterally adjacent each other. As such, the differently sized conductive features all have bottom surfaces located at a same horizontal level (e.g., plane) within the interconnect structure and top surfaces that are located on a same horizontal level (e.g., plane) within the interconnect structure. In some embodiments, alternating adjacent conductive features on the same interconnect level are of a same size.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a self-aligned permanent on-chip interconnect structure comprising:

forming a patterned photoresist having at least one opening on a surface of a substrate;

forming a dielectric sidewall structure on each sidewall of said patterned photoresist and within said at least one opening, wherein a narrowed width opening is located between neighboring dielectric sidewall structures, and wherein said forming the dielectric sidewall structure includes overfilling the at least one opening with a dielectric coating material, baking to cause diffusion of residual acid from sidewalls of the patterned photoresist into neighboring sidewall portions of the dielectric coating material and crosslinking of said neighboring sidewall portions of the dielectric coating material, and removing non-crosslinked portions of the dielectric coating material relative to the crosslinked neighboring sidewall portions of the dielectric coating material;
removing the patterned photoresist to provide additional openings between neighboring dielectric structures; and
converting each dielectric sidewall structure to form a self-aligned double patterned permanent dielectric structure.

2. The method of claim 1 wherein said forming the patterned photoresist includes selecting a positive-tone photoresist or a negative-tone photoresist, depositing the positive-tone photoresist or negative-tone photoresist, pattern-wise exposing the positive-tone photoresist or negative-tone photoresist, and developing the pattern-wised exposed positive-tone photoresist or negative-tone photoresist.

3. The method of claim 1 wherein said dielectric coating material comprises a functionalized polymer, copolymer, or a blend including at least two of any combination of polymers and/or copolymers having one or more acid-sensitive reactive groups.

4. The method of claim 1 wherein said patterned photoresist includes a patterned permanent anti-reflective coating directly below the patterned photoresist.

5. The method of claim 1 further comprising forming a protective layer on said patterned photoresist.

6. The method of claim 1 wherein said converting each dielectric sidewall structure into the self-aligned double patterned permanent dielectric structure comprises a thermal cure, an electron beam cure, an ultra-violet (UV) cure, an ion beam cure, a plasma cure, a microwave cure or a combination thereof.

7. The method of claim 1 further comprising forming at least an electrically conductive material within the narrowed width opening and the additional openings after said converting of each dielectric sidewall structure into the self-aligned double patterned permanent dielectric structure.

8. The method of claim 7 further comprising etching portions of the substrate that are exposed by said narrowed width opening and the additional openings prior to forming the electrically conductive material.

9. A method of forming a self-aligned permanent on-chip dual-damascene interconnect structure comprising:
providing a patterned dielectric material having a plurality of first openings on an upper surface of a substrate;
forming a patterned photoresist having second openings atop the patterned dielectric material, wherein a portion of said patterned photoresist remains in at least one of said plurality of first openings;
forming a dielectric sidewall structure on each sidewall of the patterned photoresist within said second openings and atop an upper surface of the patterned dielectric material, wherein said dielectric sidewall structure narrows the second openings providing narrowed width second openings;
removing the patterned photoresist to provide a third opening between neighboring dielectric sidewall structures, wherein said narrowed width second openings and said third opening are located atop and are connected with one of said plurality of first openings;
converting each dielectric sidewall structure into a self-aligned permanent patterned dielectric structure; and
filling each opening with at least an electrically conductive material.

10. The method of claim 9 wherein said forming the patterned photoresist includes selecting a positive-tone photoresist or a negative-tone photoresist, depositing the positive-tone photoresist or negative-tone photoresist, pattern-wise exposing the positive-tone photoresist or negative-tone photoresist, and developing the pattern-wised exposed positive-tone photoresist or negative-tone photoresist.

11. The method of claim 10 wherein said forming the dielectric sidewall structure providing a dielectric coating material, baking to cause diffusion of residual acid from sidewalls of the patterned photoresist into neighboring sidewall portions of the dielectric coating material and crosslinking of said neighboring sidewall portions of the dielectric coating material, and removing non-crosslinked portions of the dielectric coating material relative to the crosslinked neighboring sidewall portions of the dielectric coating material.

12. The method of claim 11 wherein said dielectric coating material comprises a functionalized polymer, copolymer, or a blend including at least two of any combination of polymers and/or copolymers having one or more acid-sensitive reactive groups.

13. The method of claim 9 wherein said patterned dielectric material includes a patterned anti-reflective coating directly below the patterned dielectric material.

14. The method of claim 9 wherein said converting each dielectric sidewall structure into the self-aligned permanent patterned dielectric structure comprises a thermal cure, an electron beam cure, an ultra-violet (UV) cure, an ion beam cure, a plasma cure, a microwave cure or a combination thereof.

15. The method of claim 9 wherein said substrate includes an antireflective coating and an optional dielectric cap, and wherein exposed positions of said antireflective coating and, if present, the optional dielectric cap are etched prior to filling the first, the second and the third openings with at least an electrically conductive material.

16. A method of fabricating a self-aligned permanent on-chip interconnect structure comprising:
forming a patterned photoresist having at least one opening on a surface of a substrate;
forming a dielectric sidewall structure on each sidewall of said patterned photoresist and within said at least one opening, wherein a narrowed width opening is located between neighboring dielectric sidewall structures;
removing the patterned photoresist to provide additional openings between neighboring dielectric structures;
converting each dielectric sidewall structure to form a self-aligned double patterned permanent dielectric structure; and
forming at least an electrically conductive material within the narrowed width opening and the additional openings after said converting of each dielectric sidewall structure into the self-aligned double patterned permanent dielectric structure.

17. The method of claim 16 wherein said forming the patterned photoresist includes selecting a positive-tone photoresist or a negative-tone photoresist, depositing the positive-tone photoresist or negative-tone photoresist, pattern-wise exposing the positive-tone photoresist or negative-tone photoresist, and developing the pattern-wised exposed positive-tone photoresist or negative-tone photoresist.

18. The method of claim 16 wherein said forming the dielectric sidewall structure includes overfilling the at least one opening with a dielectric coating material, baking to cause diffusion of residual acid from sidewalls of the patterned photoresist into neighboring sidewall portions of the dielectric coating material and crosslinking of said neighboring sidewall portions of the dielectric coating material, and removing non-crosslinked portions of the dielectric coating material relative to the crosslinked neighboring sidewall portions of the dielectric coating material.

19. The method of claim 18 wherein said dielectric coating material comprises a functionalized polymer, copolymer, or a blend including at least two of any combination of polymers and/or copolymers having one or more acid-sensitive reactive groups.

20. The method of claim 16 wherein said patterned photoresist includes a patterned permanent anti-reflective coating directly below the patterned photoresist.

21. The method of claim 16 further comprising forming a protective layer on said patterned photoresist.

22. The method of claim 16 wherein said converting each dielectric sidewall structure into the self-aligned double patterned permanent dielectric structure comprises a thermal cure, an electron beam cure, an ultra-violet (UV) cure, an ion beam cure, a plasma cure, a microwave cure or a combination thereof.

23. The method of claim 16 further comprising etching portions of the substrate that are exposed by said narrowed width opening and the additional openings prior to forming the electrically conductive material.

* * * * *